US012772552B2

(12) United States Patent
Drowley et al.

(10) Patent No.: US 12,772,552 B2
(45) Date of Patent: Oct. 20, 2026

(54) SELF-ALIGNED ISOLATION FOR SELF-ALIGNED CONTACTS FOR VERTICAL FETS

(71) Applicant: SEMICONDUCTOR COMPONENTS INDUSTRIES, LLC, Scottsdale, AZ (US)

(72) Inventors: Clifford Drowley, Santa Clara, CA (US); Hao Cui, Santa Clara, CA (US); Andrew P. Edwards, Santa Clara, CA (US); Subhash Srinivas Pidaparthi, Santa Clara, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 346 days.

(21) Appl. No.: 18/642,371

(22) Filed: Apr. 22, 2024

(65) Prior Publication Data

US 2024/0274602 A1 Aug. 15, 2024

Related U.S. Application Data

(62) Division of application No. 17/373,627, filed on Jul. 12, 2021, now Pat. No. 11,996,407.

(Continued)

(51) Int. Cl.
*H10D 84/83* (2025.01)
*H10D 30/01* (2025.01)
(Continued)

(52) U.S. Cl.
CPC ......... *H10D 84/834* (2025.01); *H10D 30/024* (2025.01); *H10D 30/6211* (2025.01);
(Continued)

(58) Field of Classification Search
CPC .. H10D 84/0158; H10D 84/834; H10D 30/62; H10D 30/6211; H10D 30/0515;
(Continued)

(56) References Cited

U.S. PATENT DOCUMENTS

2010/0320476 A1* 12/2010 Cheng .................. H10D 12/031 257/77
2011/0133211 A1 6/2011 Malhan et al.
(Continued)

FOREIGN PATENT DOCUMENTS

CN 106684141 A 5/2017

*Primary Examiner* — Tuan A Hoang
(74) *Attorney, Agent, or Firm* — Kevin B. Jackson

(57) ABSTRACT

A method for manufacturing a vertical FET device includes providing a semiconductor substrate structure including a semiconductor substrate and a first semiconductor layer coupled to the semiconductor substrate. The first semiconductor layer is characterized by a first conductivity type. The method also includes forming a plurality of semiconductor fins coupled to the first semiconductor layer. Each of the plurality of semiconductor fins is separated by one of a plurality of recess regions. The method further includes epitaxially regrowing a semiconductor gate layer including a surface region in the plurality of recess regions. The method also includes forming an isolation region within the surface region of the semiconductor gate layer. The isolation region surrounds each of the plurality of semiconductor fins. The method includes forming a source contact structure coupled to each of the plurality of semiconductor fins and forming a gate contact structure coupled to the semiconductor gate layer.

20 Claims, 14 Drawing Sheets

Related U.S. Application Data

(60) Provisional application No. 63/051,979, filed on Jul. 15, 2020.

(51) Int. Cl.

| | |
|---|---|
| ***H10D 30/62*** | (2025.01) |
| ***H10D 62/10*** | (2025.01) |
| ***H10D 84/01*** | (2025.01) |
| ***H10D 84/03*** | (2025.01) |

(52) U.S. Cl.
CPC ....... *H10D 62/115* (2025.01); *H10D 84/0151* (2025.01); *H10D 84/0158* (2025.01); *H10D 84/038* (2025.01)

(58) Field of Classification Search
CPC .... H10D 30/831; H10D 62/115; H10P 30/212
See application file for complete search history.

(56) References Cited

U.S. PATENT DOCUMENTS

| | | | | |
|---|---|---|---|---|
| 2013/0126888 | A1* | 5/2013 | Kizilyalli ............... | H10D 10/01 438/534 |
| 2015/0097226 | A1 | 4/2015 | Lichtenwalner et al. | |
| 2017/0133518 | A1 | 5/2017 | Li et al. | |
| 2018/0069087 | A1 | 3/2018 | Georgescu et al. | |
| 2019/0385917 | A1 | 12/2019 | Lee et al. | |

* cited by examiner

SELF-ALIGNED ISOLATION FOR SELF-ALIGNED CONTACTS FOR VERTICAL FETS

CROSS-REFERENCE TO RELATED APPLICATIONS

This application is a divisional application of co-pending U.S. patent application Ser. No. 17/373,627, filed on Jul. 12, 2021, which claims the benefit and priority to U.S. Provisional Patent Application No. 63/051,979, filed on Jul. 15, 2020, the disclosures of which are hereby incorporated by reference in its entirety for all purposes.

BACKGROUND

Power electronics are widely used in a variety of applications, including power conversion, electric motor drives, switching power supplies, lighting, etc. Power electronic devices such as transistors are commonly used in such power switching applications. The operation of the present generation of power transistor devices, particularly with high voltage (>600V) handling capability, is hampered by slow switching speeds, and high specific on-resistance.

Thus, there is a need in the art for power transistor devices exhibiting low capacitance, a low, positive threshold voltage, and low specific on-resistance along with high breakdown voltage.

SUMMARY

The present invention generally relates to vertical fin-based field effect transistor (FET) devices with an improved combination of leakage current, maximum electric field, and contact alignment. Merely by way of example, implementations of the present invention provide novel vertical-fin-based FET devices and methods of fabricating such FET devices with improved contact alignment, leakage current, and breakdown voltage characteristics. The disclosure provided herein is not limited to FETs and is applicable to a variety of electronic devices.

In one aspect of the present invention, a method for manufacturing a vertical FET device may include: providing a semiconductor substrate structure including a semiconductor substrate and a first semiconductor layer coupled to the semiconductor substrate, wherein the first semiconductor layer is characterized by a first conductivity type; forming a plurality of semiconductor fins coupled to the first semiconductor layer, wherein each of the plurality of semiconductor fins is separated by one of a plurality of recess regions; epitaxially regrowing a semiconductor gate layer in the plurality of recess regions, wherein the semiconductor gate layer comprises a surface region; forming an isolation region within the surface region of the semiconductor gate layer, wherein the isolation region surrounds each of the plurality of semiconductor fins; forming a source contact structure coupled to each of the plurality of semiconductor fins; and forming a gate contact structure coupled to the semiconductor gate layer.

In some embodiments, forming the isolation region within surface region of the semiconductor gate layer may include: forming a first hardmask layer on an upper surface of the semiconductor gate layer, exposing a portion of the upper surface surrounding each of the plurality of semiconductor fins; and ion implanting species into the portion of the upper surface of the semiconductor gate layer using the first hardmask as a mask.

In some embodiments, the method may further include: forming a photoresist on the semiconductor gate layer, wherein the semiconductor gate layer comprises an active region in which the plurality of semiconductor fins are formed and a terminal region adjacent the active region, and the photoresist comprises a tapered region aligned with the terminal region; and ion implanting species into the terminal region of the semiconductor gate layer using the photoresist as a mask, thereby forming a tapered element in the terminal region of the semiconductor gate layer.

In one aspect of the present invention, a vertical FET device may include: a semiconductor substrate; a first epitaxial semiconductor layer coupled to the semiconductor substrate, wherein the first epitaxial semiconductor layer is characterized by a first conductivity type; a plurality of semiconductor fins disposed on the first epitaxial semiconductor layer, wherein each of the plurality of semiconductor fins is separated by one of a plurality of recess regions; a semiconductor gate layer epitaxially regrown in the plurality of recess regions; an isolation region disposed within a portion of the semiconductor gate layer, wherein the isolation region surrounds each of the plurality of semiconductor fins; a source contact structure coupled to each of the plurality of semiconductor fins; and a gate contact structure coupled to the semiconductor gate layer.

Numerous benefits are achieved by way of the present invention over conventional techniques. For example, embodiments of the present invention provide methods and systems that utilize source isolation regions to isolate the source contact from the gate layer. For example, a source contact structure is formed over both the top of a plurality of fins and the self-aligned source isolation regions surrounding the top of each of the plurality of fins. The source contact structure electrically contacts the plurality of fins, but does not electrically contact the gate layer. The resulting source contact structure is self-aligned to the top of each of the plurality of fins. The above techniques allow relaxed processing conditions for the source contact structure to the top of each of the plurality of fins by allowing the source contact structure to be oversized relative to the dimension of each of the plurality of fins, and also minimize the leakage between the source contact structure and the adjacent gate layer. Moreover, some embodiments provide a self-aligned source contact to reduce or eliminate alignment issues in the contact formation process and thereby minimize parasitic capacitances. These and other embodiments of the invention along with many of its advantages and features are described in more detail in conjunction with the text below and attached figures.

BRIEF DESCRIPTION OF THE DRAWINGS

The accompanying drawings form a part of the present disclosure, that describe exemplary embodiments of the present invention. The drawings together with the specification will explain the principles of the invention.

DETAILED DESCRIPTION

Embodiments of the present disclosure will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

Embodiments of the present invention relate to vertical-fin-based field effect transistor (FET) devices. More particular, embodiments of the present invention relate to a vertical FET device with improved contact alignment, leakage current, and maximum electric field characteristics. Merely by way of example, embodiments of the present invention relate to a vertical FET device with a source isolation region within a regrown epitaxial gate layer and a method for manufacturing such a vertical FET device. Many advantages can be obtained by utilization of the source isolation region, such as improved leakage current and maximum electric field.

Figure 1:
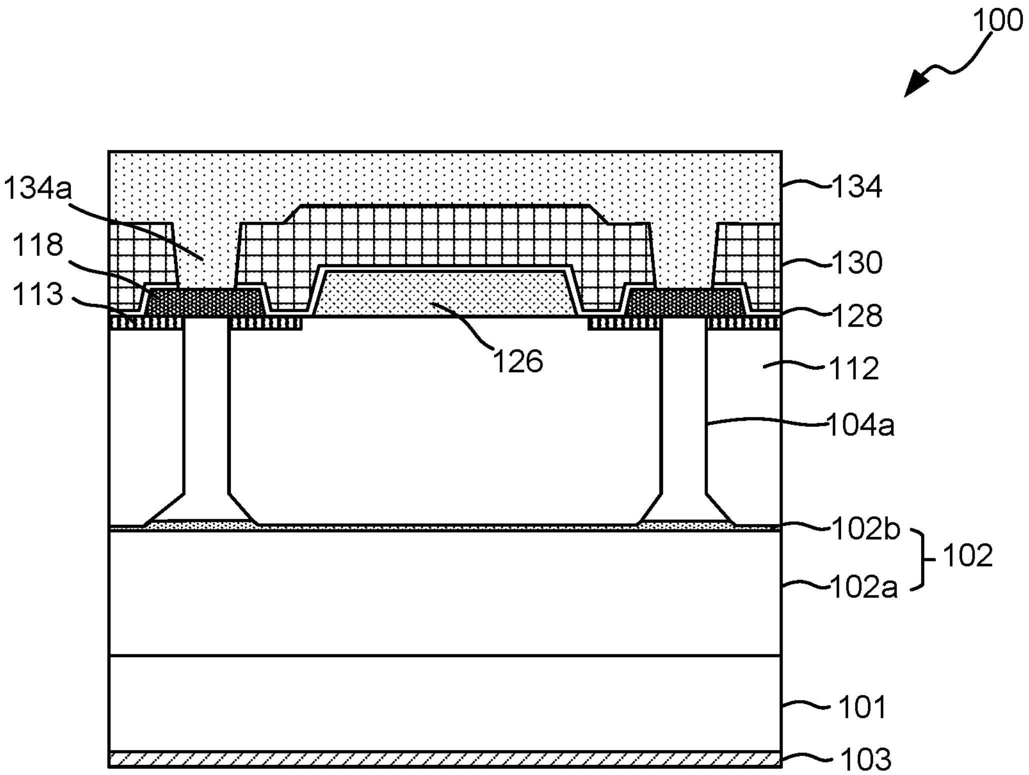
FIG. 1 is a partial cross-sectional view of a vertical FET device according to some embodiments of the present invention.

FIG. 1 is a cross-sectional view of a vertical fin-based field effect transistor device 100 according to an embodiment of the present disclosure. The terms "FET," "FinFET," and "vertical fin-based FET" are interchangeably used herein. Referring to FIG. 1, a vertical fin-based FET device 100 may include a III-nitride substrate 101, a drift layer 102 including a uniformly doped region 102*a* disposed on III-nitride substrate 101 and a graded doping region 102*b* disposed on uniformly doped region 102*a*, and a plurality of fins 104*a* protruding from graded doping region 102*b*. In some embodiments, each of the fins 104*a* may include source contact structure 118. In some embodiments, source contact structure 118 may include a stack of layers including a titanium (Ti) layer, an aluminum (Al) layer, and a barrier metal layer (e.g., molybdenum (Mo), titanium (Ti), tantalum (Ta), or similar).

Vertical FET device 100 may further include a gate layer 112 having a bottom portion in direct contact with graded doping region 102*b*, a source isolation region 113 disposed in the upper portion of gate layer 112 and surrounding fins 104*a*, a gate contact structure 126 disposed on gate layer 112, a first interlayer dielectric (ILD) layer 128 disposed on source contact structure 118, isolation region 113, and gate contact structure 126, and a second ILD layer 130 disposed on first ILD layer 128. In some embodiments, gate contact structure 126 may include a stack of layers including a nickel (Ni) layer, a first gold (Au) layer disposed on the nickel (Ni) layer, a barrier metal (e.g., molybdenum (Mo), titanium (Ti), tantalum (Ta), or similar) layer disposed on the first gold (Au) layer, and a second gold (Au) layer disposed on the barrier layer.

Vertical FET device 100 may also include a conductive material 134 with a first via contact 134*a* extending through first ILD layer 128 and second ILD layer 130 and in contact with source contact structure 118. Vertical FET device 100 may also include a drain metal contact 103 on the bottom surface of III-nitride substrate 101. As used herein, the terms "drift layer" and "drift region" are used interchangeably, the terms "doped layer" and "doped region" are used interchangeably, and the terms "graded doping region" and "graded doping layer" are used interchangeably.

In some embodiments, III-nitride substrate 101 may include an n+ doped III-nitride material, fins 104*a* may include an n doped III-nitride material having a first dopant concentration, uniformly doped region 102*a* of drift region 102 may include an n doped III-nitride material having a second dopant concentration lower than the first dopant concentration, and graded doping region 102*b* may have a third dopant concentration that linearly increases from the second dopant concentration to the first dopant concentration.

In some embodiments, the first dopant concentration is about $1.3\times10^{17}$ atoms/$cm^3$, and the second dopant concentration is about $1\times10^{16}$ atoms/$cm^3$.

In some embodiments, the drift region has a thickness of about 12 μm, the graded doping region has a thickness of about 0.3 μm, and the fin has a height in a range between about 0.6 μm and 0.8 μm and a width of about 0.2 μm.

In some embodiments, gate layer 112 may include a p+ doped III-nitride material. For example, the dopant may be Mg, and the dopant concentration may be about $1\times10^{19}$ atoms/$cm^3$. In some embodiments, gate layer 112 is disposed in a recess region between two adjacent fins 104*a*. For example, the recess region may have a width of about 1.6-2.5 μm.

Figure 2A:
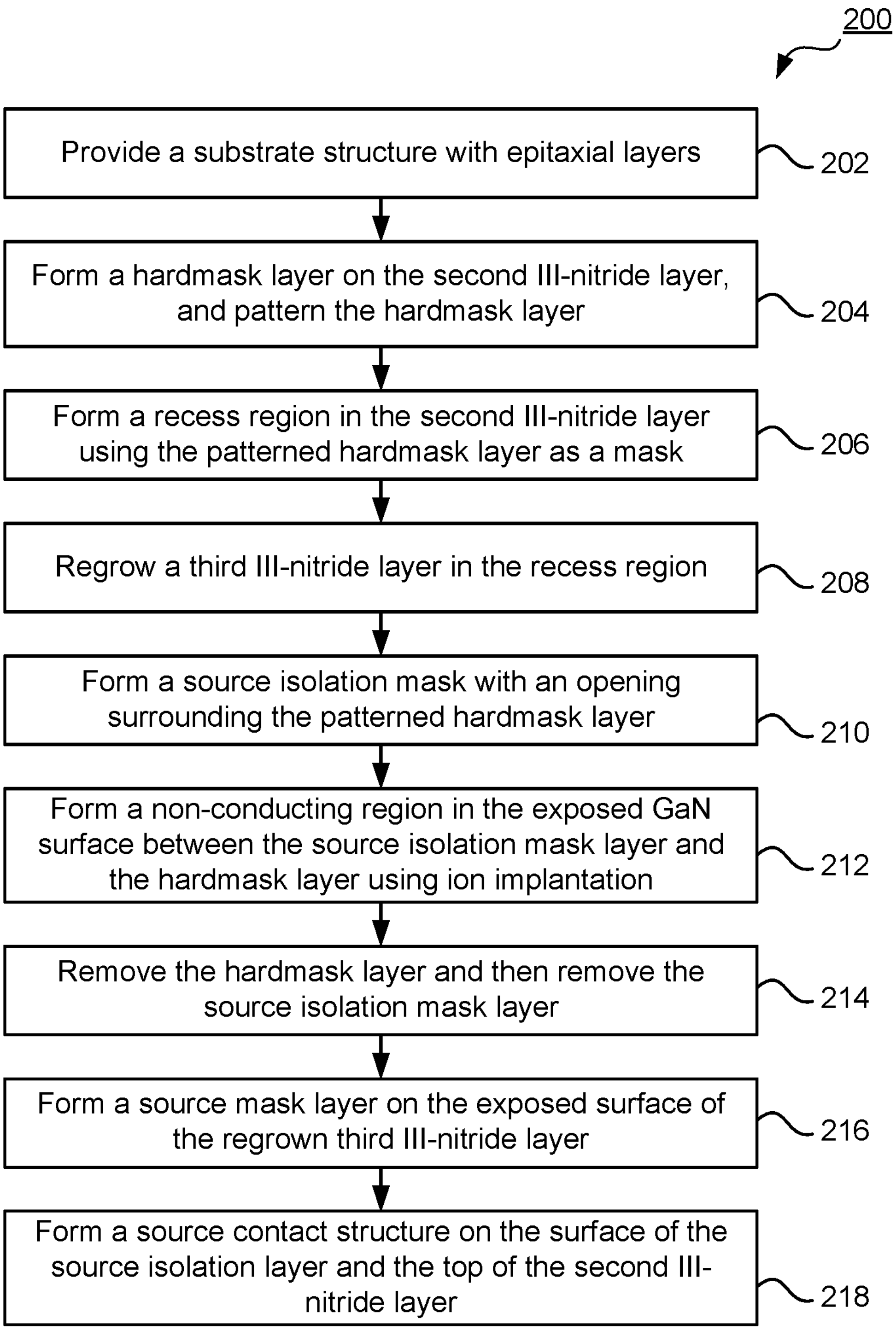
FIG. 2 is a simplified flowchart illustrating a method for manufacturing a vertical FET device according to some embodiments of the present invention.
Figure 2B:
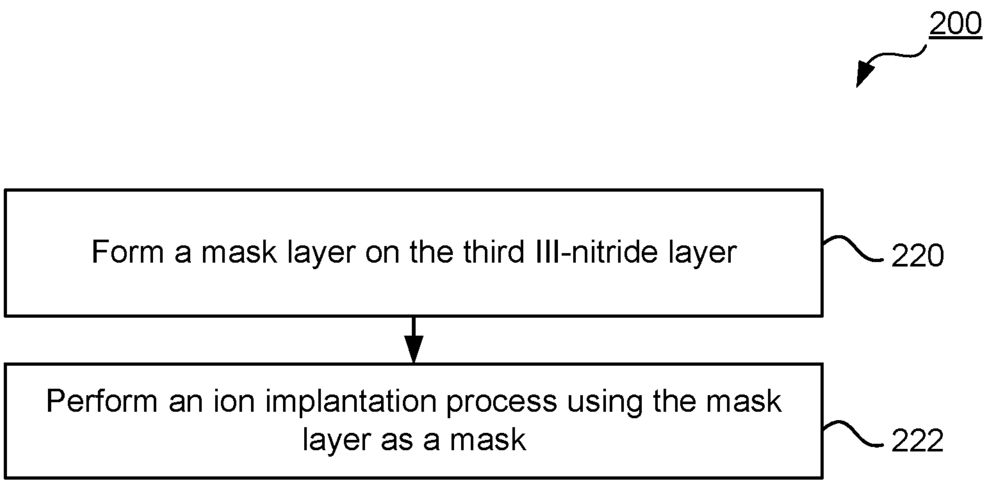
Figure 2C:
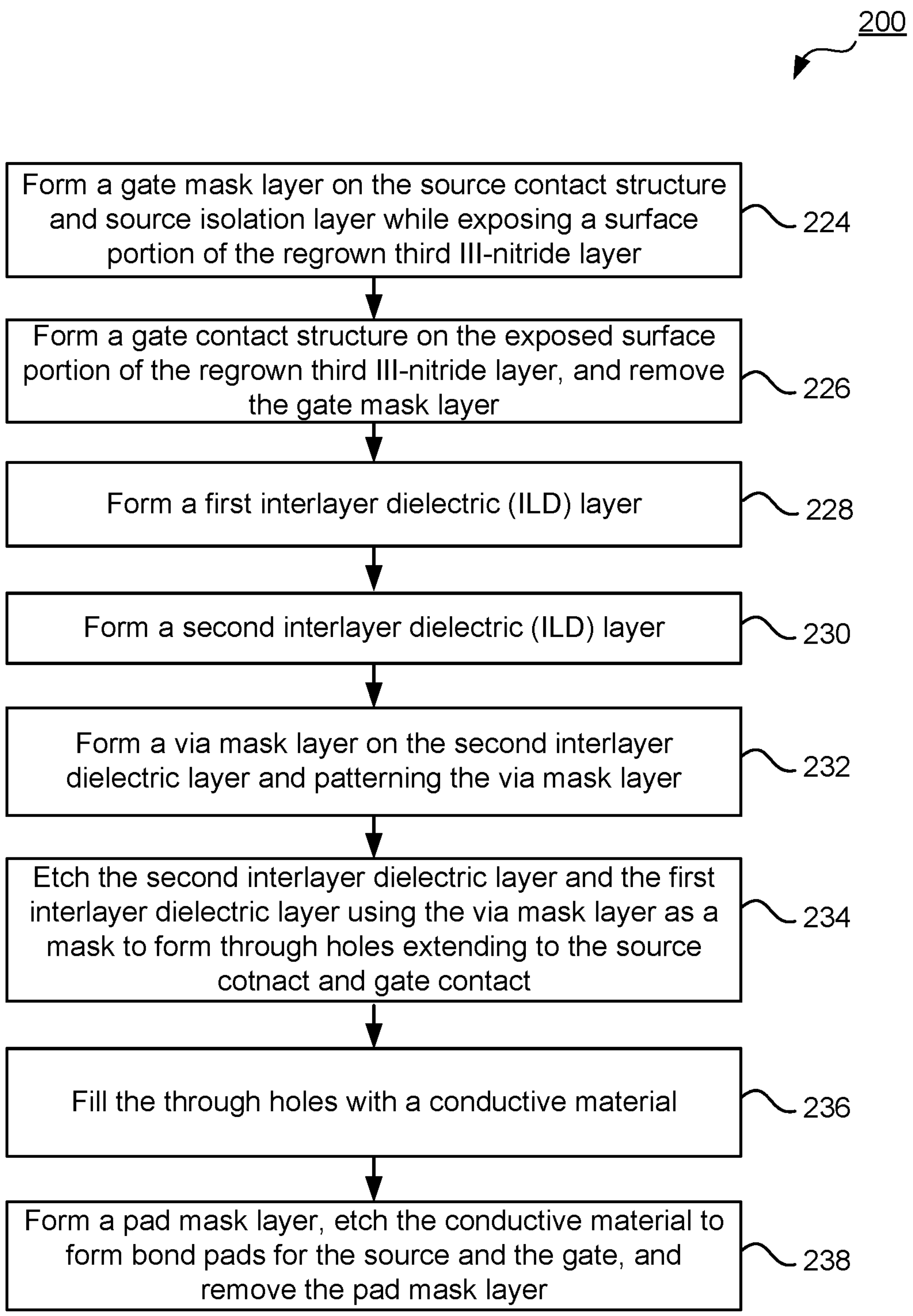

Embodiments of the present invention further provide a method for manufacturing a vertical FET device. FIG. 2 is a simplified flowchart illustrating a method 200 for manufacturing a vertical FET device according to some embodiments of the present invention. Referring to FIG. 2, method 200 may include providing a substrate structure with epitaxial layers (202). Specifically, method 200 may include providing a III-nitride substrate. In some embodiments, the III-nitride substrate is an n+ GaN substrate having a resistivity of about 0.014±0.0025 ohm-cm. In some embodiments, the III-nitride substrate is an n+ GaN substrate doped with one or more of oxygen, silicon, or germanium.

Method 200 may further include forming a first III-nitride layer on the III-nitride substrate. In some embodiments, the first III-nitride layer is epitaxially grown on the III-nitride substrate at a temperature between 950 and 1150° C. and is characterized by a first dopant concentration, e.g., n-type doping with a net dopant concentration of about $1\times10^{16}$ atoms/$cm^3$. In some embodiments, the first III-nitride layer is a drift layer including a uniformly doped region (layer) on the III-nitride substrate and a graded doping region (layer) on the uniformly doped region. In some embodiments, the uniformly doped region has a thickness of about 12 μm, and the graded doping region has a thickness of about 0.3 μm. In some embodiments, the uniformly doped region (layer) may have a dopant concentration of about $1\times10^{16}$ atoms/$cm^3$, and the graded doped region (layer) may have graded dopant concentrations increasing from $1\times10^{16}$ atoms/$cm^3$ to $1.3\times10^{17}$ atoms/$cm^3$. In some embodiments, the graded doped region can improve device electrical variability in the presence of manufacturing variations. In some embodiments, the surface of III-nitride substrate is miscut from the c-plane at an angle to facilitate high-quality epitaxial growth for high-voltage operation of the drift layer.

Method 200 may include forming a second III-nitride layer on the first III-nitride epitaxial layer. In some embodiments, the second III-nitride epitaxial layer is epitaxially grown on the first III-nitride epitaxial layer with a thickness of about 0.7 μm and is characterized by a second dopant concentration, e.g., n-type doping. The second dopant concentration is higher than the first dopant concentration in some embodiments. In some embodiments, the second dopant concentration is about $1.3\times10^{17}$ atoms/$cm^3$. In some embodiments, the doping concentration and thickness of the second III-nitride layer are designed to achieve the desired channel conduction, threshold voltage, and/or punch-through characteristics of the vertical FET device.

Then, method 200 may include forming a hardmask layer (e.g., on the second III-nitride layer) and patterning the hardmask layer (204). In some embodiments, the hardmask layer may include $Si_3N_4$ and is formed with a thickness of about 400 nm by a plasma-enhanced chemical vapor deposition (PECVD) process at about 300° C. In some embodiments, a patterned hardmask may be formed using a reactive-ion etching (RIE) process with F-based chemistry. In some embodiments, a composite hardmask is formed by depositing a metal layer and then a dielectric layer to form the composite hardmask. In these embodiments, as will be evident to one of skill in the art, the composite hardmask is then patterned prior to performing etching processes.

Method 200 may further include forming a recess region (e.g., in the second III-nitride layer) using the patterned hardmask layer as a mask (206). In some embodiments, an etching process is performed using the hardmask layer as mask to etch the second III-nitride layer. In some embodiments, the etching process may include an RIE process with $Cl_2$-based chemistry. In some embodiments, the etching process extends approximately 0.1 μm into the graded zone of the first III-nitride layer. After the etching process, a plurality of fins are formed in the second III-nitride layer. In some embodiments, the III-nitride material is GaN. In some embodiments, the etching process may include a wet etch after the RIE etch, e.g., 25% trimethyl ammonium hydroxide (TMAH) by weight in water at 85° C., which anisotropically etches the III-nitride layer to form vertical sidewalls on the fins which are substantially parallel to the $1\bar{1}20$ plane of the III-nitride crystal (the "m-plane").

Method 200 may further include regrowing a third III-nitride layer in the recess region (208). The regrown III-nitride epitaxial layer may form a gate layer. In some embodiments, the regrown third III-nitride layer has a conductivity type opposite the conductivity type of the first and second III-nitride epitaxial layers. For example, the third III-nitride layer may include p-doped GaN material.

Method 200 may further include forming a source isolation mask with an opening surrounding the patterned hardmask layer (210). In some embodiments, the source isolation mask is formed on the exposed upper surface of the third III-nitride layer. In some embodiments, the source isolation mask includes photoresist.

Method 200 may further include forming a non-conducting region (i.e., the source isolation region 113 illustrated in FIG. 1) in the exposed GaN surface between the source isolation mask layer and the hardmask layer using ion implantation (212). Specifically, an ion implantation process is performed using the source isolation mask as a mask to implant dopants into the third III-nitride layer. The implanted dopants pass through the opening in the source isolation mask and stop in a region of the third III-nitride layer that surrounds each of the plurality of fins. The energy of the implantation is chosen such that the implanted dopants do not pass through the hardmask layer, so that the top of the second III-nitride layer in the fin is unimplanted. In some embodiments, the implant dopants may include nitrogen, helium, or argon.

In some embodiments, the ion implantation process may introduce compensating donor levels in the third III-nitride layer to form the source isolation region, which is a semi-insulating III-nitride region. In such embodiments, dopants may include oxygen and silicon. Such dopants may also introduce damage and traps into the third III-nitride layer.

In some embodiments, the ion implantation process may implant metallic ions into the third III-nitride layer. In such embodiments, the implant dopants may introduce deep levels in the third III-nitride layer to form the source isolation region, which is a semi-insulating III-nitride region. Such dopants may include iron, titanium, and nickel.

In some embodiments, the ion implantation process may implant ions that physically damage the crystal lattice of the third III-nitride layer to create the source isolation region, which is a non-conducting region. The damage may be extreme enough to create amorphous III-nitride material. A variety of ions can be used for this purpose, as long as the total dose is high enough to damage the III-nitride material.

In some embodiments, the source isolation region may be formed using a plasma treatment. For example, a pulsed-plasma doping (pulsed plasma-immersion ion-implantation (PIII) may be performed to implant hydrogen dopants into the third III-nitride layer to form the source isolation region. The hydrogen dopants may deactivate the p-type dopants in the third III-nitride layer. Thus, a variety of techniques can be utilized to fabricate source isolation region 113 illustrated in FIG. 1. One of ordinary skill in the art would recognize many variations, modifications, and alternatives.

Then, method 200 may further include removing the hardmask layer and then removing the source isolation mask layer (214). In some embodiments, a dry etch process or a plasma etch process may be performed to remove the hardmask layer, and the source isolation mask layer is stripped using a dry plasma or a wet chemistry or a combination thereof.

Method 200 may further include forming a source mask layer on the exposed surface of the regrown third III-nitride layer (216). Specifically, the source mask layer is formed overlaying the exposed upper surface of the third III-nitride layer and having an opening exposing the upper surface of the plurality of fins and a portion of the source isolation layer. In some embodiments, the source mask layer may include an overhang extending over the opening. In some embodiments, the source mask layer is lift-off capable and has a bottom opening critical dimension ("CD") of 0.65 μm and a top opening CD of 0.55 μm.

Method 200 may further include forming a source contact structure on the surface of the source isolation layer and the top of the second III-nitride layer (218). In some embodiments, the source contact structure is formed by deposition through the openings in the source mask layer. In some embodiments, the source contact structure is formed by deposition at a temperature of about 150° C. on the exposed upper surface of the plurality of fins. In some embodiments, the source contact structure may include a stack structure comprising a first source metal layer on the upper surface of fins, a second source metal layer on first source metal layer, and a third source metal layer on the second source metal layer. In some embodiments, the first source metal layer includes Ti having a thickness of about 25 nm, the second source metal layer includes Al having a thickness of about 100 nm, and the third source metal layer includes Mo having a thickness of about 45 nm. After the deposition of the metal layers, the source mask layer is removed. In some embodiments, a rapid temperature annealing (RTA) treatment then may be performed in $N_2$ at 600° C. for 600 seconds. After the RTA treatment, the source contact structure will have a specific resistance of less than about $1\times10^{-5}$ ohm-$cm^2$.

In some embodiments, method 200 may further include steps forming a junction termination structure for the vertical FET device. Referring to FIG. 2, method 200 may include forming a mask layer on the third III-nitride layer (220). For clarity of description, the third III-nitride layer includes an active region where the plurality of fins are located, and a termination region adjacent to the active region. In some embodiments, the mask layer may include a planar region aligned with the active region and a tapered region aligned with at least a portion of the terminal region. In some embodiments, the tapered region may be formed using a greyscale photomask in a photolithography process.

Method 200 may further include performing an ion implantation process using the mask layer as a mask (222). In some embodiments, an ion beam irradiates the third III-nitride layer through the mask layer. Due to the tapered region, implant dopants stop in the III-nitride layer to form a damage zone. Thus, a tapered junction terminal structure is formed in the third III-nitride layer. In some embodiments, the damage zone has a conductivity less than that of the third III-nitride layer. In some embodiments, the damage zone may form a non-conductive zone. In some embodiments, the implanted ions species may be argon, nitrogen, helium, or other appropriate species that reduce the electrical conductivity in the third III-nitride layer.

In some embodiments, method 200 may additionally include steps of forming a gate contact structure and interlayer dielectric layers over the source contact structure and the gate contact structure. Referring to FIG. 2, method 200 may further include forming a gate mask layer on the source contact structure and source isolation layer while exposing a surface portion of the regrown third III-nitride layer (224). Specifically, the gate mask layer is formed overlaying the source contact structure and having an opening exposing the upper surface of the third III-nitride layer. In some embodiments, the gate mask layer may include an overhang extending over the opening. In some embodiments, the gate mask layer is lift-off capable and has a top opening CD of 0.8 μm and a bottom opening CD of 0.9 μm.

Method 200 may further include forming a gate contact structure on the exposed surface portion of the regrown third III-nitride layer, and removing the gate mask layer (226). In some embodiments, the gate contact structure is formed by deposition through the opening onto the exposed surface portion of the third III-nitride layer. In some embodiments, the gate contact structure may include a stack structure comprising a first gate metal layer on the surface portion of the third III-nitride layer, a second gate metal layer on the first gate metal layer, a third gate metal layer on the second gate metal layer, and a fourth gate metal layer on the third gate metal layer. In some embodiments, the first gate metal layer includes Ni with a thickness of about 20 nm, the second gate metal layer includes Au with a thickness of about 20 nm, the third gate metal layer includes Mo with a thickness of about 45 nm, and the fourth gate metal layer includes Au with a thickness of about 300 nm.

Method 200 may further include forming a first interlayer dielectric (ILD) layer (228). In some embodiments, the first interlayer dielectric layer is deposited covering the gate contact structure, the source contact structure, and the surface of the third III-nitride layer, using a plasma-enhanced chemical vapor deposition (PECVD) process at a temperature of 300° C. In some embodiments, the first interlayer dielectric layer is relatively conformal. In some embodiments, the first interlayer dielectric layer has a thickness of approximately 50 nm and may include a nitride compound (e.g., silicon nitride).

Method 200 may further include forming a second interlayer dielectric (ILD) layer (230). In some embodiments, the second interlayer dielectric layer is deposited on the first dielectric layer, using a plasma-enhanced chemical vapor deposition (PECVD) process at a temperature of 300° C. In some embodiments, the second interlayer dielectric layer has a thickness of approximately 300 nm and may include an oxide compound (e.g., silicon oxide).

Method 200 may further include forming a via mask layer on the second interlayer dielectric layer and patterning the via mask layer (232). In some embodiments, the via mask layer includes photoresist. In some embodiments, the via mask layer has a CD of about 0.40 μm. In some embodiments, the via mask layer is patterned using a photolithography process to form a first opening exposing a first portion of the upper surface of the second interlayer dielectric layer that is aligned with the source contact structure.

Then, method 200 may further include etching the second interlayer dielectric layer and the first interlayer dielectric layer using the via mask layer as a mask to form through holes extending to the source contact and gate contact (234). In some embodiments, the etching process forms a through hole extending to the source contact structure. In some embodiments, the aspect ratio (AR) of the through hole is less than 1. For example, the AR may be 0.8. In some embodiments, the via mask layer is also patterned to form a second opening exposing a second portion of the upper surface of the second interlayer dielectric layer that is aligned with the gate contact structure. The etching process may form a through hole extending to the gate contact structure. Then method 200 may include filling the through holes with a conductive material (236).

Method 200 may further include forming a pad mask layer, etching the conductive material to form bond pads for the source and the gate, and removing the pad mask layer (238). In some embodiments, an etching process is performed using an inductively coupled plasma (ICP) process with $Cl_2$-based chemistry.

It should be appreciated that the specific steps illustrated in FIG. 2 provide a particular method for manufacturing a vertical FET device with a self-aligned source contact according to an embodiment of the present invention. Other sequences of steps may also be performed according to alternative embodiments. For example, alternative embodiments of the present invention may perform the steps outlined above in a different order. Moreover, the individual steps illustrated in FIG. 2 may include multiple sub-steps that may be performed in various sequences as appropriate to the individual step. Furthermore, additional steps may be added or removed depending on the particular application. One of ordinary skill in the art would recognize many variations, modifications, and alternatives.

Figure 3A:
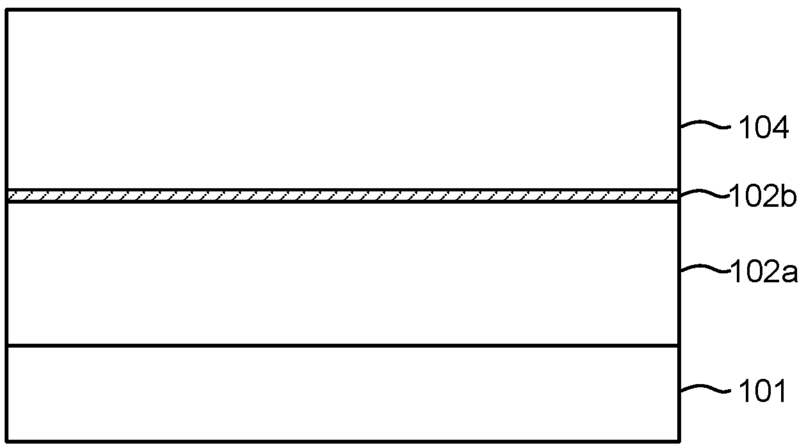
FIGS. 3A, 3B, 3C, 3D, 3E, 3F, 3G, 3H, 3I, 3J, 3K, 3L, 3M, 3N, 3O, and 3P illustrate the intermediate stages of a method for manufacturing a vertical FET device according to some embodiments of the present invention.
Figure 3B:
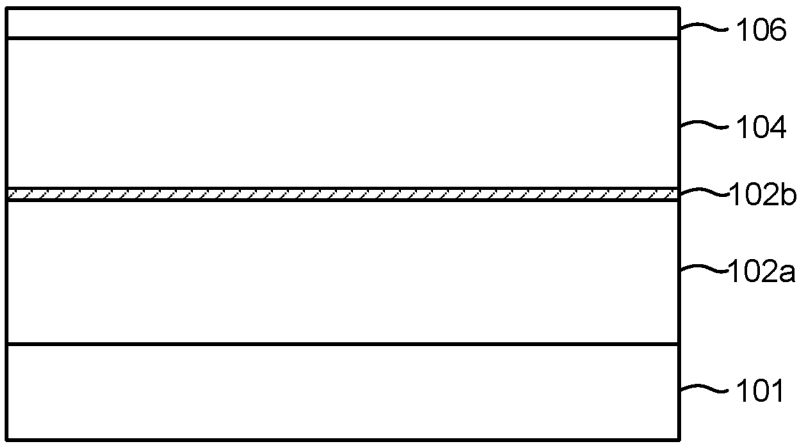
Figure 3C:
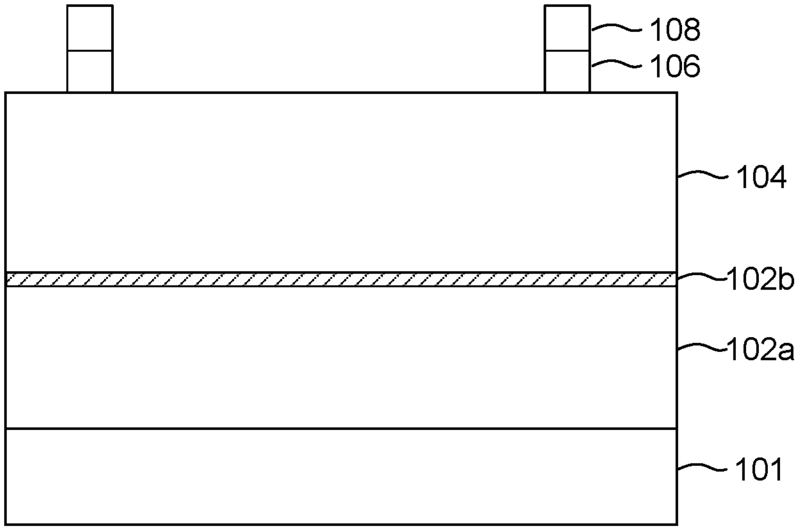
Figure 3D:
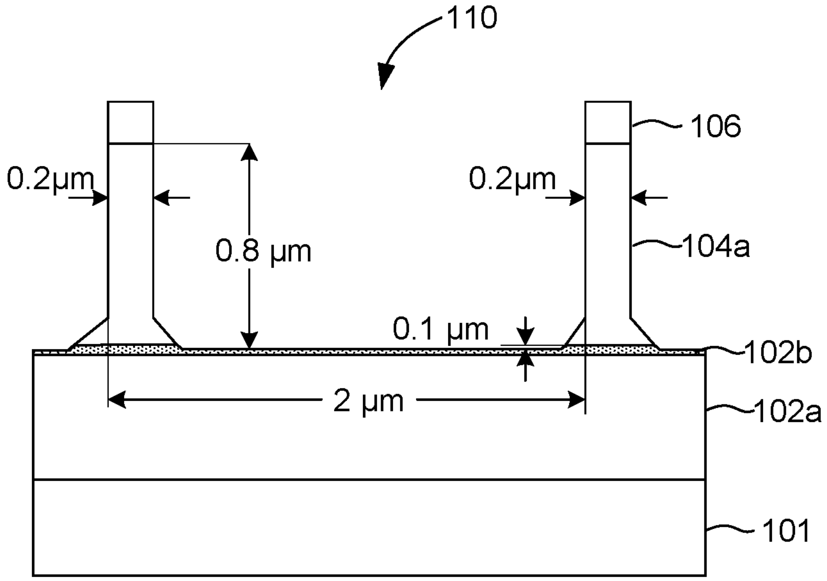
Figure 3E:
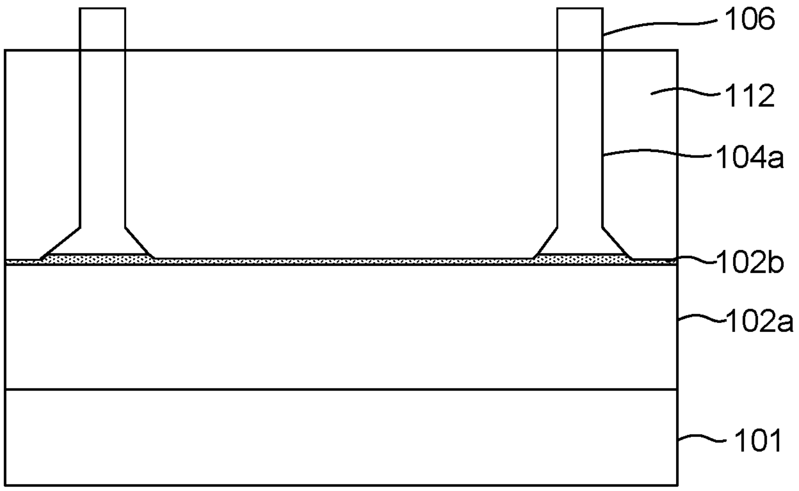
Figure 3F:
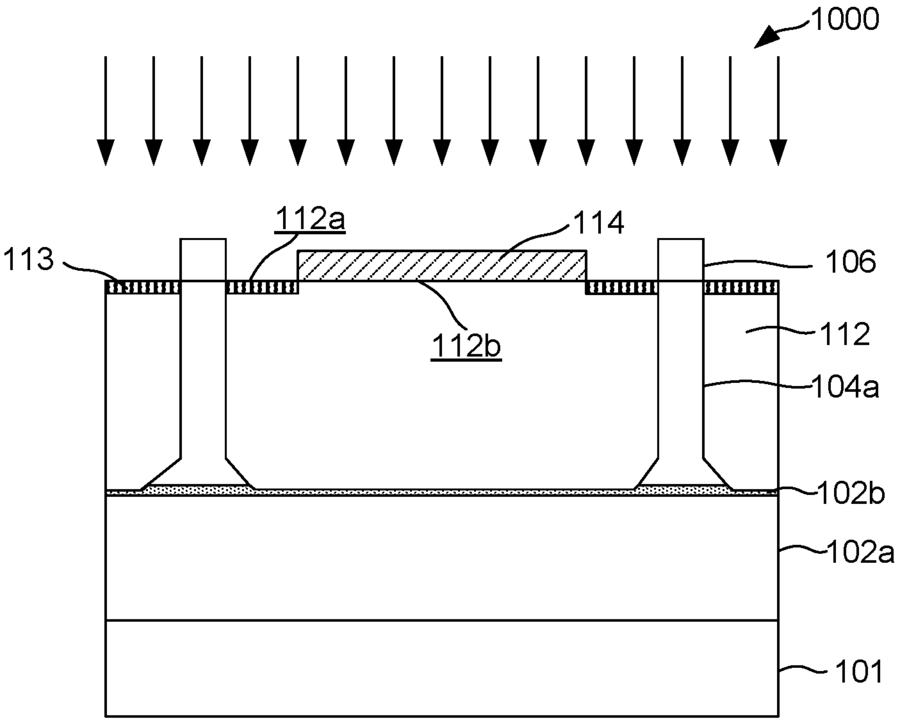
Figure 3G:
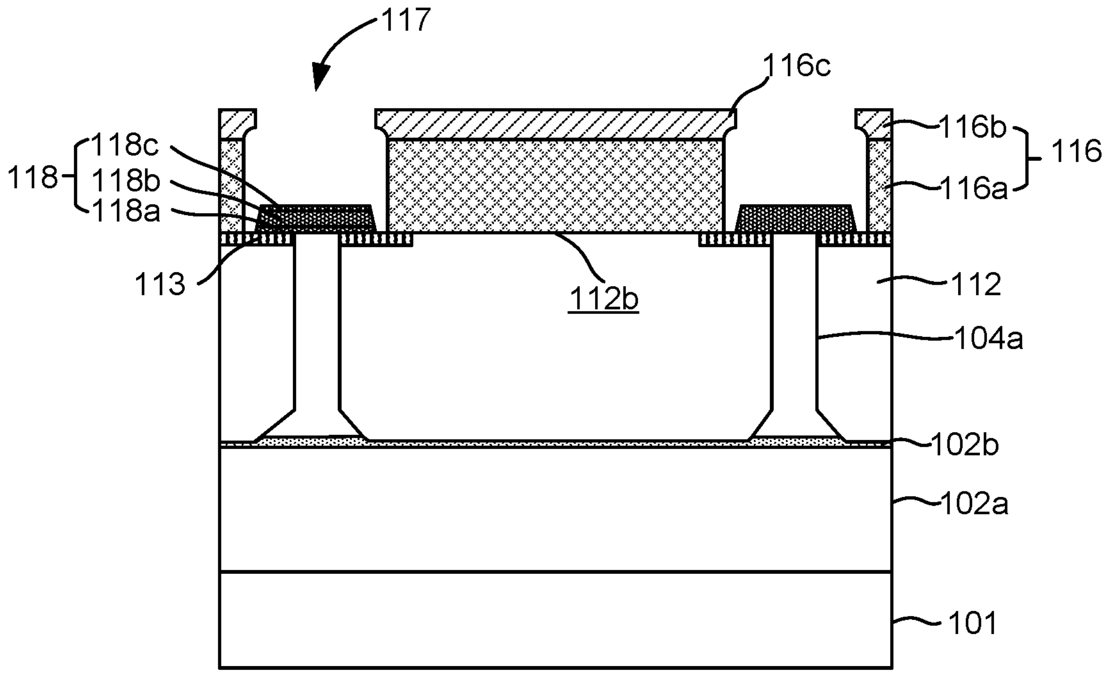
Figure 3H:
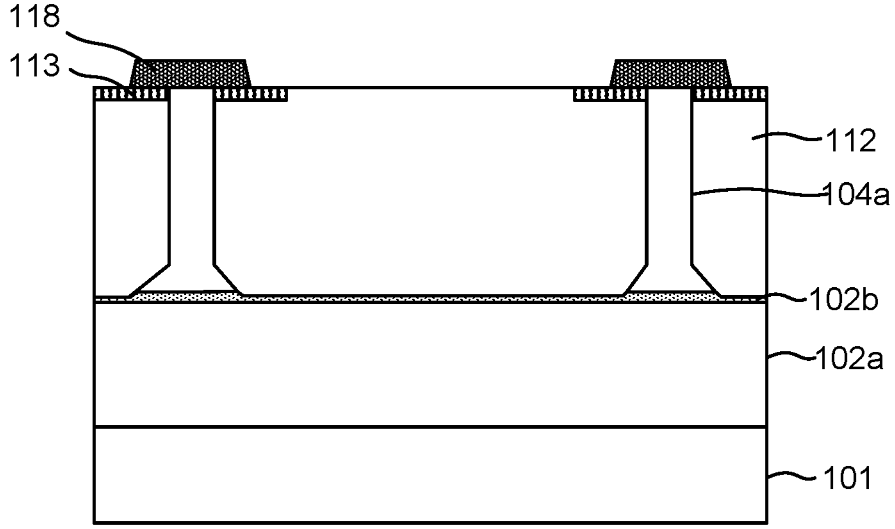
Figure 3I:
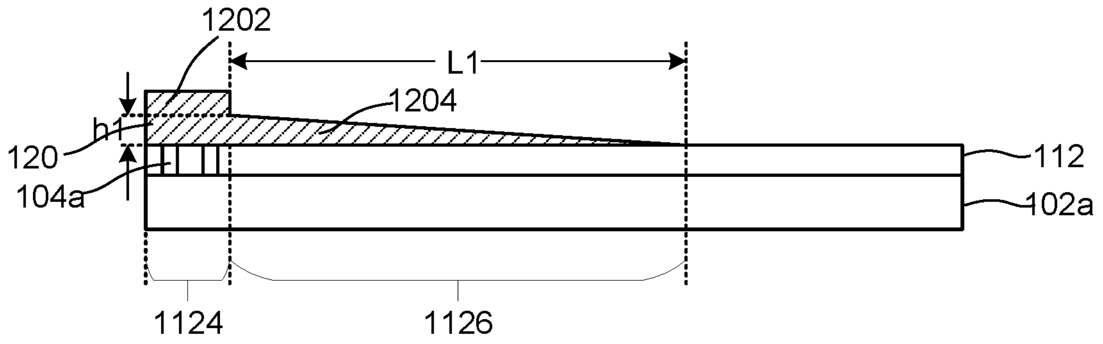
Figure 3J:
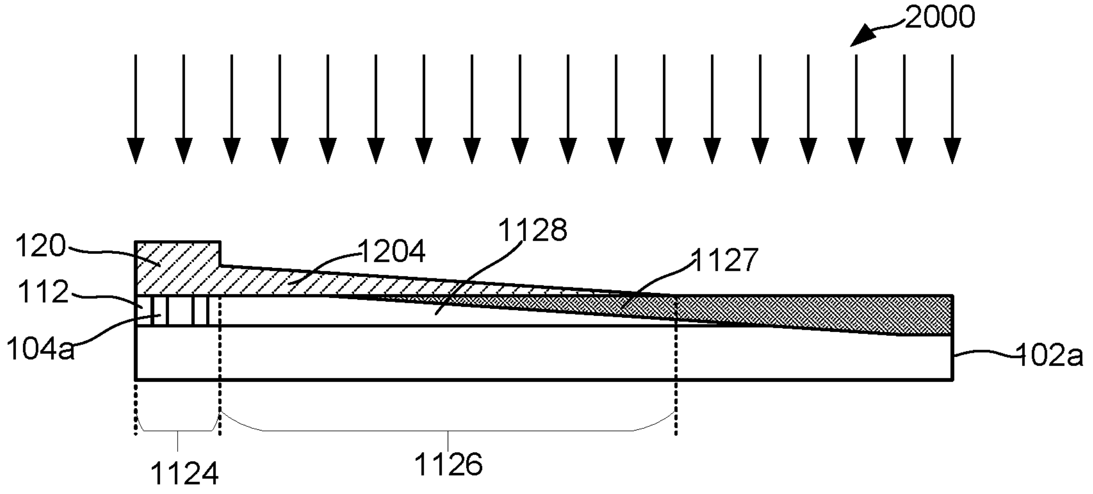
Figure 3K:
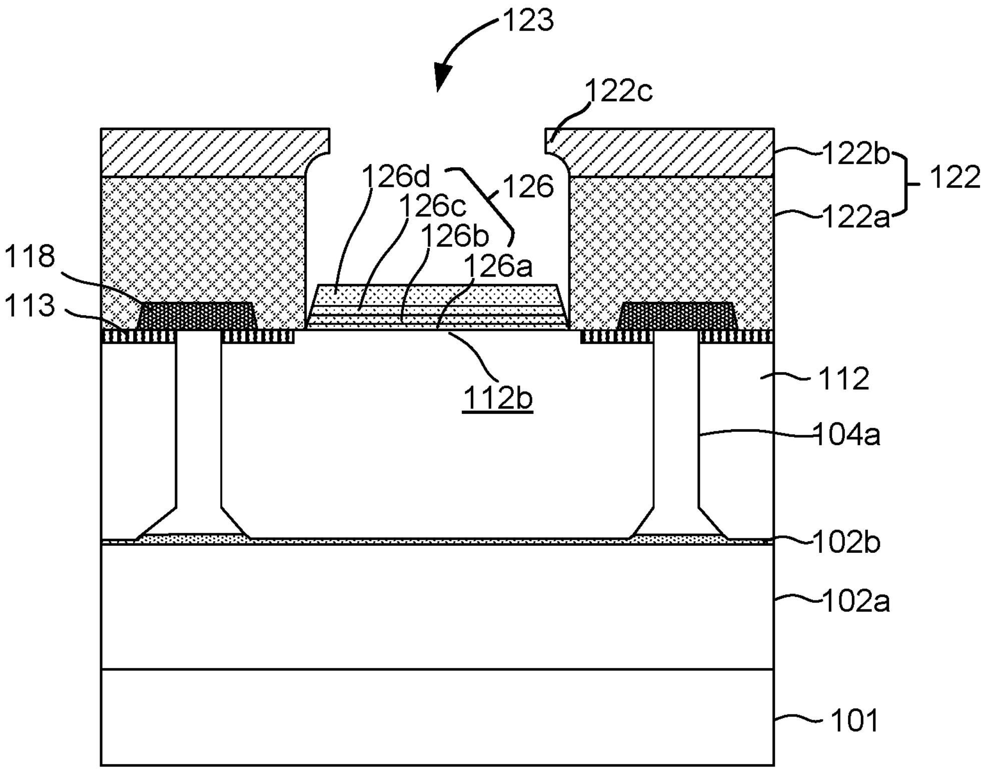
Figure 3L:
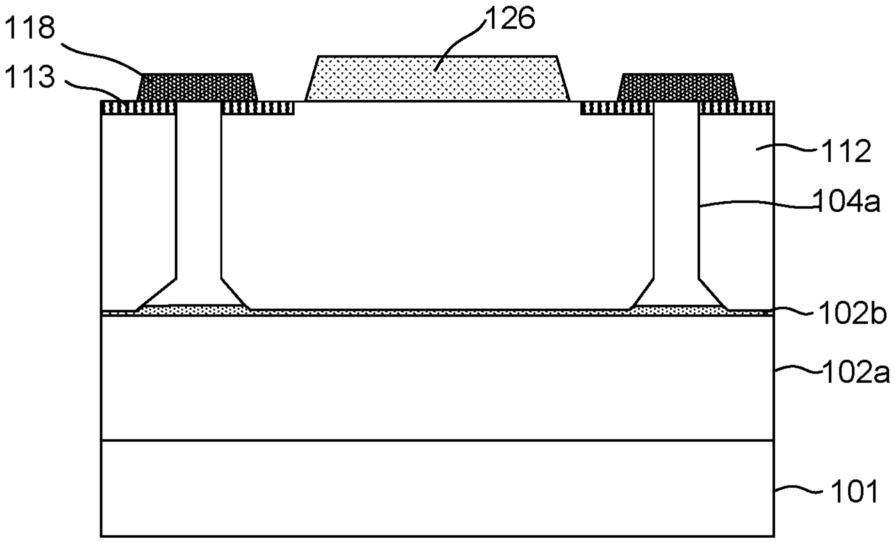
Figure 3M:
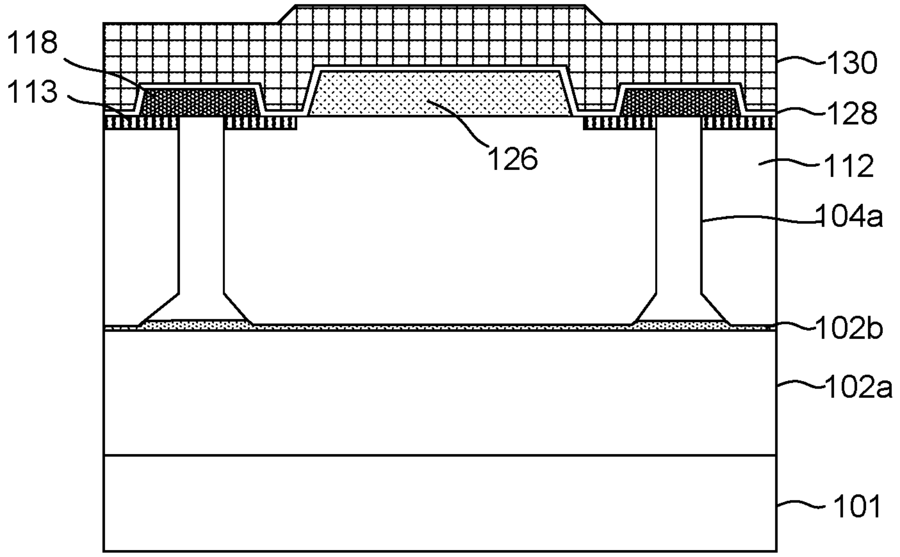
Figure 3N:
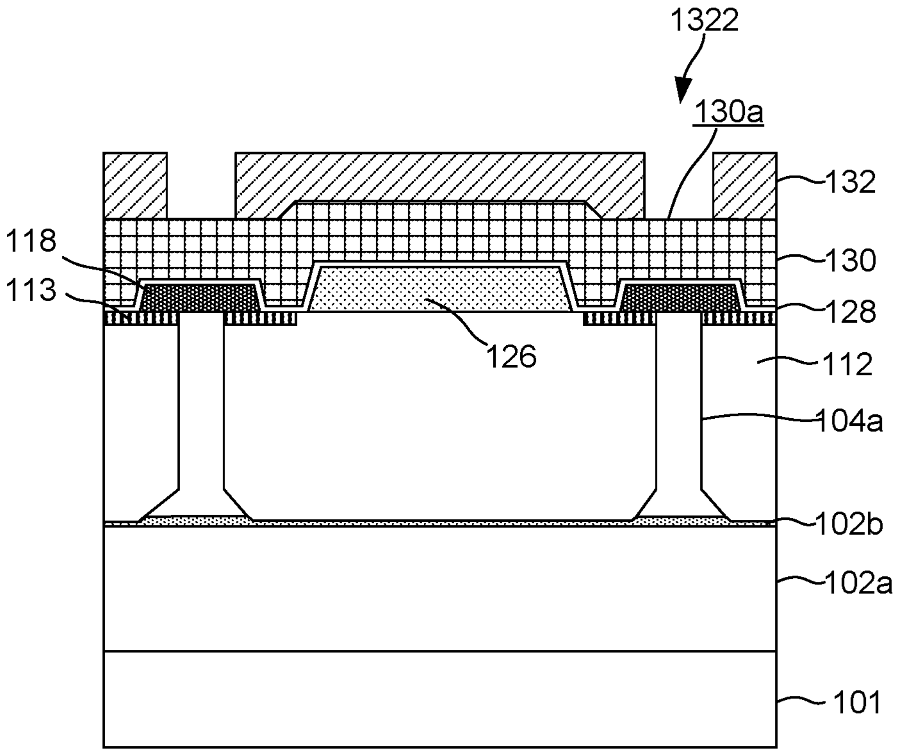
Figure 3O:
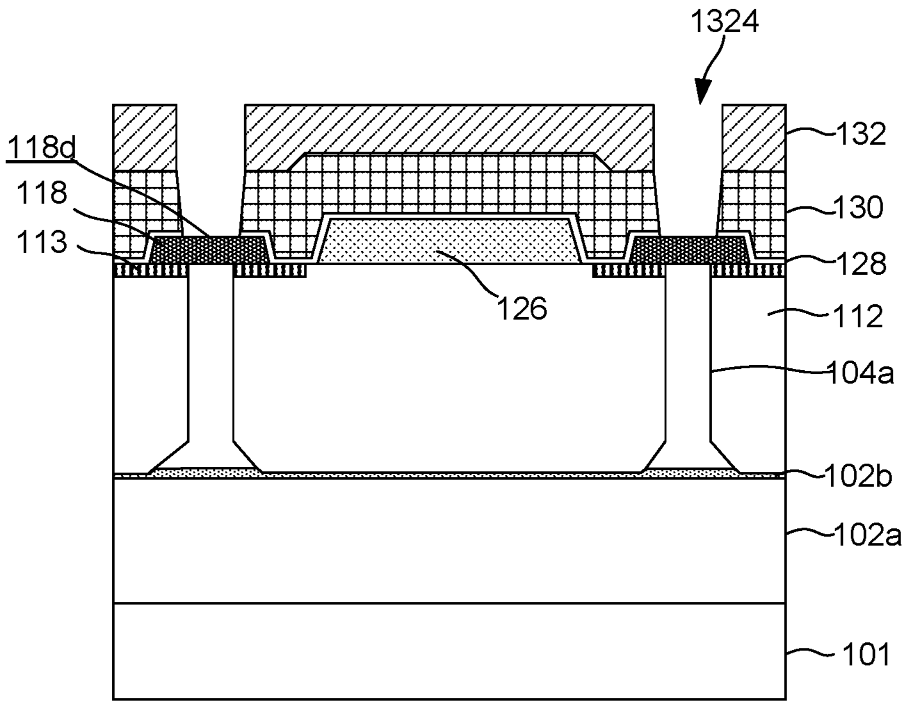
Figure 3P:
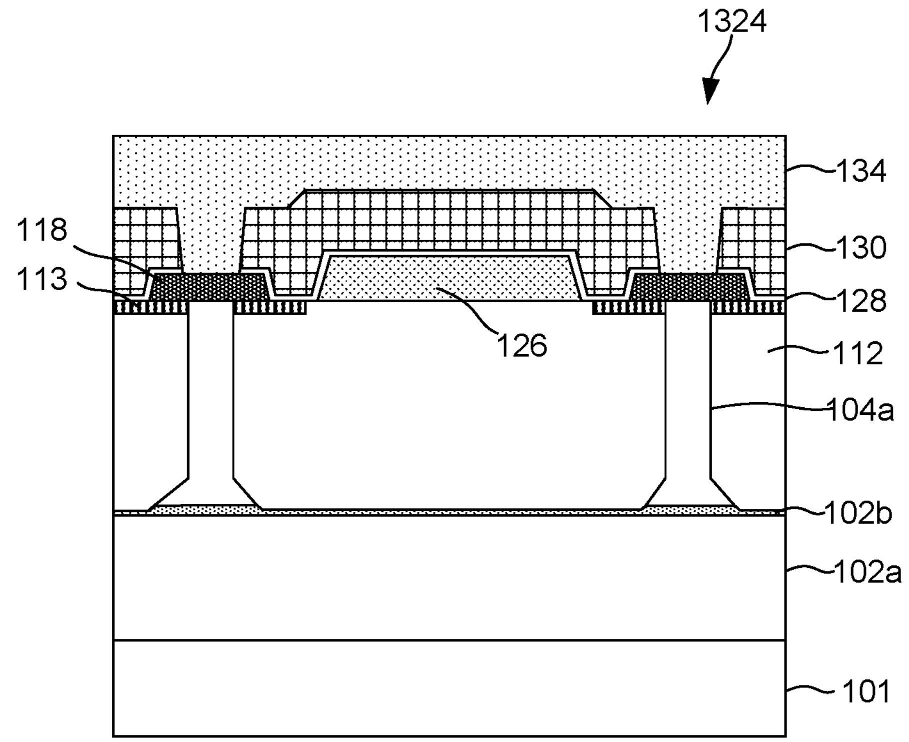

FIGS. 3A-3P illustrate the intermediate stages of a method for manufacturing a vertical FET device according to some embodiments of the present invention. Referring to FIG. 3A, an n+ doped III-nitride substrate 101 is provided. An n− doped first III-nitride layer 102*a* is epitaxially grown on III-nitride substrate 101 at a temperature between 950 and 1200° C., preferably between 1000 and 1150° C., and more preferably about 1100° C. A second n doped III-nitride layer 104 is epitaxially grown on first III-nitride layer 102*a* at a temperature between 950 and 1200° C., preferably between 1000 and 1150° C., and more preferably about 1100° C. In some embodiments, n+ doped III-nitride substrate 101 is heavily doped with n-type dopants in a dopant concentration in a range of about $5\times10^{17}$ atoms/$cm^3$ to about $1\times10^{19}$ atoms/$cm^3$ and a resistivity of less than 0.014±0.0025 ohm-cm. First III-nitride layer 102*a* is a drift layer having a thickness of about 12 μm and a dopant concentration of about $1\times10^{16}$ atoms/$cm^3$. Second III-nitride layer 104 is a fin conduction layer having uniform doping with n-type dopants of about $1.3\times10^{17}$ atoms/$cm^3$ and a thickness of about 0.7 μm. A graded doped region 102*b* having a thickness of about 0.3 μm is disposed between the first III-nitride layer 102*a* and second III-nitride layer 104 and has a dopant concentration that linearly increases from about $1\times10^{16}$ atoms/$cm^3$ to $1.3\times10^{17}$ atoms/$cm^3$, i.e., from the first III-nitride layer 102*a* toward the second III-nitride layer 104.

Referring to FIG. 3B, a hardmask layer 106 is formed on second III-nitride layer 104. In some embodiments, hardmask layer 106 may include $Si_3N_4$ and is formed with a thickness of about 400 nm by PECVD at about 300° C. In some embodiments, hardmask layer 106 may include a refractory metal contact layer under a dielectric layer. In some embodiments, hardmask layer 106 may include only a dielectric layer.

Referring to FIG. 3C, hardmask layer 106 (illustrated in FIG. 3B) is patterned using a photoresist layer 108 to form patterned hardmask 107. In some embodiments, photoresist layer 108 may be patterned using a deep UV (DUV) lithography process. Then, hardmask layer 106 may be etched using an RIE process with F-based chemistry to form patterned hardmask 107. Then, photoresist layer 108 is removed.

Referring to FIG. 3D, an etching process is performed using to form patterned hardmask 107 as a mask to form a plurality of fins 104*a*. The fins 104*a* each have a width of about 0.2 μm, a height in a range between about 0.7 μm and 0.8 μm, and are spaced apart from each other by a space of about 2 μm, i.e., the fin pitch is about 2 μm. To achieve a uniform height for the fins, good controllability of the depth of the etch process is utilized. In some embodiments, the etching process may include $Cl_2$-based chemistry using an RIE process and is carried out to remove a portion of second III-nitride layer 104 to form a recess region 110. In some embodiments, the etching process may extend 0.1 μm into graded doping region 102*b*. In some embodiments, the vertical FET device may include a plurality of fins 104*a* arranged in rows and columns, and the plurality of fins 104*a* are all aligned in the same crystallographic direction. In some embodiments, layers 102*a*, 102*b* and 104 are GaN, and the sidewalls of fins 104*a* are parallel to an m-plane (i.e., the $\{1\bar{1}00\}$ plane) of the GaN crystal.

It is noted that the bottom portion of the fins may have a shape different from the shape shown in FIG. 3D after the etching process. Embodiments of the present disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. It is understood that the bottom portion of the fins may have rounded or curved features. Thus, the regions illustrated in the figures are schematic in nature, and their shapes are not intended to illustrate the actual shape of a region of a device and are not intended to limit the scope of the invention.

In some embodiments, after forming the recess regions, a cleaning process is performed to clean the etched surface. In some embodiments, an anisotropic wet-chemical etching process is performed to define the sidewalls of the plurality fins 104*a* as crystallographic planes (such as the m-plane) of the III-nitride material. In some embodiments, the cleaning process is performed using a tetramethylammonium hydroxide (TMAH) solution of about 25% by weight, at a temperature of about 85° C., and for a duration of about 30 minutes. In another embodiment, prior to performing a cleaning using the TMAH solution, a pre-cleaning such as piranha clean using a $H_2SO_4$:$H_2O$ in a volume ratio 2:1 for 2 minutes may also be performed.

Referring to FIG. 3E, after the cleaning, a third III-nitride layer 112 is epitaxially grown in recess region 110. In some embodiments, before regrowing third III-nitride layer 112, polish etching is performed using an RIE process under a low power with $Cl_2$-based chemistry. Then a second cleaning process is performed using a TMAH solution of about 25% by weight, at a temperature of about 85° C., and for a duration of about 5 minutes. In some embodiments, third III-nitride layer 112 may include a p-type GaN layer that is grown non-conformally in the recess region at a temperature of about 950° C. up to a thickness that is substantially planar to the bottom of patterned hardmask 107. In some embodiments, third III-nitride layer 112 is epitaxially grown using a metalorganic vapor phase epitaxy (MOVPE) process. In some embodiments, the thickness of third III-nitride layer 112 is about 840 nm. The p-type GaN layer may be doped with Mg with a dopant concentration of about $1\times10^{19}$ atoms/$cm^3$. Thereafter, an RTA process is performed in $N_2$ at 850° C. for 5 minutes to activate the Mg dopant atoms. The Mg atoms are then activated in the p-type GaN layer in an amount of greater than 1% by weight.

Referring to FIG. 3F, a source isolation mask layer 114 is formed on third III-nitride layer 112. In some embodiments, source isolation mask layer 114 is formed on a portion 112*b* of the upper surface of third III-nitride layer 112, exposing a portion 112*a* surrounding each of the plurality of fins 104*a*. Then, an ion implantation process is performed using source isolation mask layer 114 as a mask to implant dopants into the portion 112*a* of third III-nitride layer 112, in order to form a source isolation region 113 in third III-nitride layer 112 surrounding each of the plurality of fins 104*a*. The energy of ion beam 1000 and the thickness of patterned hardmask 107 are chosen such that no ions are implanted in to the top of fins 104*a*. In some embodiments, source isolation region 113 may have a lower conductivity than that of third III-nitride layer 112. In some embodiments, source isolation region 113 may be formed as a non-conductive region.

In some embodiments, ion beam 1000 with low energy irradiates the portion 112*a* to implant dopants into third III-nitride layer 112 to form source isolation region 113. In some embodiments, the implant dopants may include helium, nitrogen, or argon.

In some embodiments, the ion implantation process may introduce compensating donor levels in third III-nitride layer 112 to form source isolation region 113, which is a semi-insulating III-nitride region. In such embodiments, dopants may include oxygen and silicon. Such dopants may also introduce damage and traps into third III-nitride layer 112.

In some embodiments, the ion implantation process may implant metallic ions into third III-nitride layer 112. In such embodiments, the implant dopants may introduce deep levels in third III-nitride layer 112 to form source isolation region 113, which is a semi-insulating III-nitride region. Such dopants may include iron, titanium, and nickel.

In some embodiments, the ion implantation process may implant ions that physically damage the crystal lattice of third III-nitride layer 112 to create source isolation region 113, which is a non-conducting region. The damage may be sufficient to create amorphous III-nitride material. A variety of ions can be used for this purpose, as long as the total dose is high enough to damage the III-nitride material.

In some embodiments, source isolation region 113 may be formed using a plasma treatment. For example, a PIII or a pulsed-plasma doping (pulsed PIII) process may be performed to implant hydrogen dopants into third III-nitride layer 112 to form source isolation region 113. The hydrogen dopants may deactivate the p-type dopants in third III-nitride layer 112.

In some embodiments, source isolation region 113 may be formed by damaging the exposed surface with a plasma etch, such as a chlorine-containing or argon-containing plasma etch, so that the source isolation region 113 becomes non-conductive. It should be noted that the present invention is not limited to the above described techniques to form source isolation regions 113. In some embodiments, the above described techniques may be combined as appropriate to a particular application.

Then, patterned hardmask 107 is removed. For example, a dry etch process, wet etch process, or a plasma etch process is performed to remove patterned hardmask 107. In some embodiments that include a refractory metal in hardmask layer 106, the refractory metal remains in contact with the top of the plurality of fins 104*a*. Then, source isolation mask layer 114 is removed. For example, source isolation mask layer 114 is stripped using a dry plasma or a wet chemistry.

Referring to FIG. 3G, a source mask layer 116 is formed on the exposed surface of the regrown third III-nitride layer 112. Specifically, source mask layer 116 is formed overlaying the exposed the portion 112*b* of the upper surface of third III-nitride layer 112 and having an opening 117 exposing the upper surface of the plurality of fins 104*a* and a portion of source isolation region 113. In some embodiments, source mask layer 116 may include a first source mask layer 116*a* and a second source mask layer 116*b* formed on first source mask layer 116*a*. Second source mask layer 116*b* may include an overhang 116*c* extending over opening 117. In some embodiments, source mask layer 116 is lift-off capable and has a bottom CD of 0.65 μm and a top CD of 0.55 μm.

Referring to FIG. 3G, a source contact structure 118 is formed on top of each of the plurality of fins 104*a*, overlapping a portion of source isolation region 113. In some embodiments, source contact structure 118 is formed by deposition at a temperature of about 150° C. on the exposed upper surface of the plurality of fins 104*a*. In some embodiments, the lateral extent of source contact structure 118 is less than that of source isolation region 113. In some embodiments, an extremely poor electrical contact is formed between source contact structure 118 and source isolation region 113. In some embodiments, source contact structure 118 may include a stack structure comprising a first source metal layer 118*a* on the upper surface of fins 104*a*, a second source metal layer 118*b* on first source metal layer 118*a*, and a third source metal layer 118*c* on second source metal layer 118*b*. In some embodiments, first source metal layer 118*a* includes Ti having a thickness of about 25 nm, second source metal layer 118*b* includes Al having a thickness of about 100 nm, and third source metal layer 118*c* includes Mo having a thickness of about 45 nm. In some embodiments, an RTA treatment may be performed in $N_2$ at 600° C. for 600 seconds. After the RTA treatment, the source contact structure will have a specific resistance of less than about $1\times10^{-5}$ ohm-cm$^2$.

Referring to FIG. 3H, source mask layer 116 (illustrated in FIG. 3G) is removed. For example, source mask layer 116 may be stripped or lifted off.

Referring to FIGS. 3I-3J, a junction termination structure is formed in third III-nitride layer 112. For clarity of illustration, the scale of FIGS. 3I-3J has been exaggerated, and source contact structure 118 and source isolation region 113 are not shown.

Referring to FIG. 3I, a mask layer 120 is formed on third III-nitride layer 112, overlaying source contact structure 118 (not shown) and source isolation region 113 (not shown). For clarity of description, third III-nitride layer 112 includes an active region 1124 where the plurality of fins 104*a* are located, and a termination region 1126 adjacent to active region 1124. In some embodiments, mask layer 120 may include a planar region 1202 aligned with active region 1124 and a tapered region 1204 aligned with at least a portion of terminal region 1126. In some embodiments, the thickness h1 of the beginning portion of tapered region 1204 may be about 1.4 μm. The length L1 of tapered region 1204 may be in the range of about 5 μm-75 μm. In some embodiments, mask layer 120 may include positive photoresist. In some embodiments, tapered region 1204 may be formed using a greyscale photomask in a photolithography process. A method of forming tapered region 1204 is described in U.S. patent application Ser. No. 17/369,600, filed on Jul. 7, 2021, entitled "METHOD AND SYSTEM OF JUNCTION TERMINATION EXTENSION IN HIGH VOLTAGE SEMICONDUCTOR DEVICES," the contents of which is hereby incorporated by reference in its entirety for all purposes.

Referring to FIG. 3J, an ion implantation process is performed using mask layer 120 as a mask. In some embodiments, ion beam 2000 irradiates third III-nitride layer 112 through mask layer 120. Due to tapered region 1204, implant dopants stop in III-nitride layer 112 to form a damage zone 1127. Thus, tapered junction terminal structure 1128 is formed in third III-nitride layer 112. In some embodiments, damage zone 1127 has a conductivity less than that of third III-nitride layer 112. In some embodiments, damage zone 1127 may form a non-conductive zone. In some embodiments, a portion of damage zone 1127 may extend into a portion of first III-nitride layer 102*a* (graded doping region 102*b* is not shown for clarity of illustration). In some embodiments, the implanted ions species may be argon, nitrogen, helium, or other appropriate species that reduce the electrical conductivity in third III-nitride layer 112. In some embodiments, the implant dopants may include n type dopants, the implantation energy may be 30 keV, and the implant doses may be up to $5\times10^{16}$ cm$^{-2}$. In some embodiments, the implant dopants may include n type dopants, the implantation energy may be 180 keV, and the implant doses may be $1.6\times10^{13}$ cm$^{-2}$. In some embodiments, the implant dopants may include n+ type dopants, the implantation energy may be 600 keV, and the implant doses may be $2.5\times10^{13}$ cm$^{-2}$. After the ion implantation process, mask layer 120 is removed.

In some embodiments, source contact structure 118 is formed over both the top of the plurality of fins 104*a* and the self-aligned source isolation regions 113 surrounding the top of each of the plurality of fins 104*a*. Source contact structure 118 electrically contacts the plurality of fins 104*a*, but does not electrically contact third III-nitride layer 112. The resulting source contact structure 118 is self-aligned to the top of each of the plurality of fins 104*a*. The above techniques allow relaxed processing for the source contact structure to the top of each of the plurality of fins 104*a* by allowing source contact structure 118 to be oversized relative to the dimension of each of the plurality of fins 104*a*, and also minimize leakage between source contact structure 118 and adjacent third III-nitride layer 112.

Referring to FIG. 3K, a gate mask layer 122 is formed on third III-nitride layer 112, overlaying source contact structure 118 and source isolation region 113. It should be noted that junction terminal structure 1128 is not shown for clarity of illustration. Gate mask layer 122 is patterned with an opening 123 through which the portion 112*b* of the upper surface of third III-nitride layer 112 is exposed. In some embodiments, the portion 112*b* of the upper surface of third III-nitride layer 112 does not overlap source isolation region 113. In some embodiments, gate mask layer 122 may include a first gate mask layer 122*a* and a second gate mask layer 122*b* formed on first gate mask layer 122*a*. Second gate mask layer 122*b* may include an overhang 122*c* extending over opening 123. In some embodiments, gate mask layer 122 is lift-off capable and has a top CD of 0.8 μm and a bottom CD of 0.9 μm. Then, a gate contact structure 126 is formed by deposition through opening 123 onto the exposed surface portion 112*b* of third III-nitride layer 112. In some embodiments, gate contact structure 126 does not overlap source isolation region 113. In some embodiments, gate contact structure 126 may include a stack structure comprising a first gate metal layer 126*a* on the surface portion 112*b* of third III-nitride layer 112, a second gate metal layer 126*b* on first gate metal layer 126*a*, a third gate metal layer 126*c* on second gate metal layer 126*b*, and a fourth gate metal layer 126*d* on third gate metal layer 126*c*. In some embodiments, first gate metal layer 126*a* includes Ni with a thickness of about 20 nm, second gate metal layer 126*b* includes Au with a thickness of about 20 nm, third gate metal layer 126*c* includes Mo with a thickness of about 45 nm, and fourth gate metal layer 126*d* includes Au with a thickness of about 300 nm. In some embodiments, gate contact structure 126 has a specific resistance of 0.1 ohm/sq.

Referring to FIG. 3L, gate mask layer 122 (illustrated in FIG. 3K) is removed. In some embodiments, an RTA treatment may be performed in $O_2$ at 500° C. for 10 minutes. After the thermal treatment, gate contact structure 126 will have a specific resistance of less than about $1\times10^{-3}$ ohm-$cm^2$.

Referring to FIG. 3M, a first interlayer dielectric (ILD) layer 128 is formed on third III-nitride layer 112, overlaying source contact structure 118, source isolation region 113, and gate contact structure 126. In some embodiments, first ILD layer 128 is formed using a PECVD process at a temperature of 300° C. In some embodiments, first ILD layer 128 is relatively conformal. In some embodiments, first ILD layer 128 has a thickness of approximately 50 nm and may include nitride (e.g., silicon nitride). Then, a second ILD layer 130 is formed on first ILD layer 128. In some embodiments, second ILD layer 130 is deposited on first ILD layer 128, using a PECVD process at a temperature of 300° C. In some embodiments, second ILD layer 130 has a thickness of approximately 300 nm and may include oxide (e.g., silicon oxide).

Referring to FIG. 3N, a via mask layer 132 is formed on second ILD layer 130. In some embodiments, via mask layer 132 includes photoresist. In some embodiments, via mask layer 132 has a CD of about 0.40 μm. In some embodiments, via mask layer 132 is patterned using a photolithography process to form a first opening 1322 exposing a first portion 130*a* of the upper surface of second ILD layer 130 that is aligned with source contact structure 118. In some embodiments, via mask layer 132 is also patterned to form a second opening (not shown) exposing a second portion of the upper surface of the second interlayer dielectric layer that is aligned with gate contact structure 126.

Referring to FIG. 3O, an etching process is performed using via mask layer 132 as a mask to etch second ILD layer 130 and first ILD layer 128. In some embodiments, the etching process continues until a surface portion 118*d* of the upper surface of source contact structure 118 is exposed. After the etching process, a through hole 1324 through first ILD layer 128 and second ILD layer 130 is formed with the surface portion 118*d* of the upper surface of source contact structure 118 exposed in through hole 1324. In some embodiments, the aspect ratio (ratio of height to width, "AR") of through hole 1324 is less than 1. For example, the AR may be 0.8. Then, via mask layer 132 is removed. For example, via mask layer 132 is stripped from second ILD layer 130. Optionally, a clean process is performed to clean the through hole 1324.

Referring to FIG. 3P, through hole 1324 is filled with a conductive material 134. In some embodiments, conductive material 134 also overlays second ILD layer 130. Then a pad metal deposition is performed on the conductive material 134 by evaporation to a thickness of about 4 μm to form pad metal layer 135. In some embodiments, a pad mask (not shown) may be formed on conductive material 134. Then, an etching process can be performed using the pad mask as a mask in an ICP process with $Cl_2$-based chemistry to form bond pads for the source and the gate. Then, the pad mask can be stripped. In some embodiments, the conductive material 134 is in electrical contact with source contact structure 118. In other embodiments, the etching process illustrated in FIG. 3O results in a portion of the upper surface of each of the plurality of semiconductor fins being exposed. In these embodiments, the conductive material 134 is in electrical contact with plurality of semiconductor fins. One of ordinary skill in the art would recognize many variations, modifications, and alternatives.

Figure 4A:
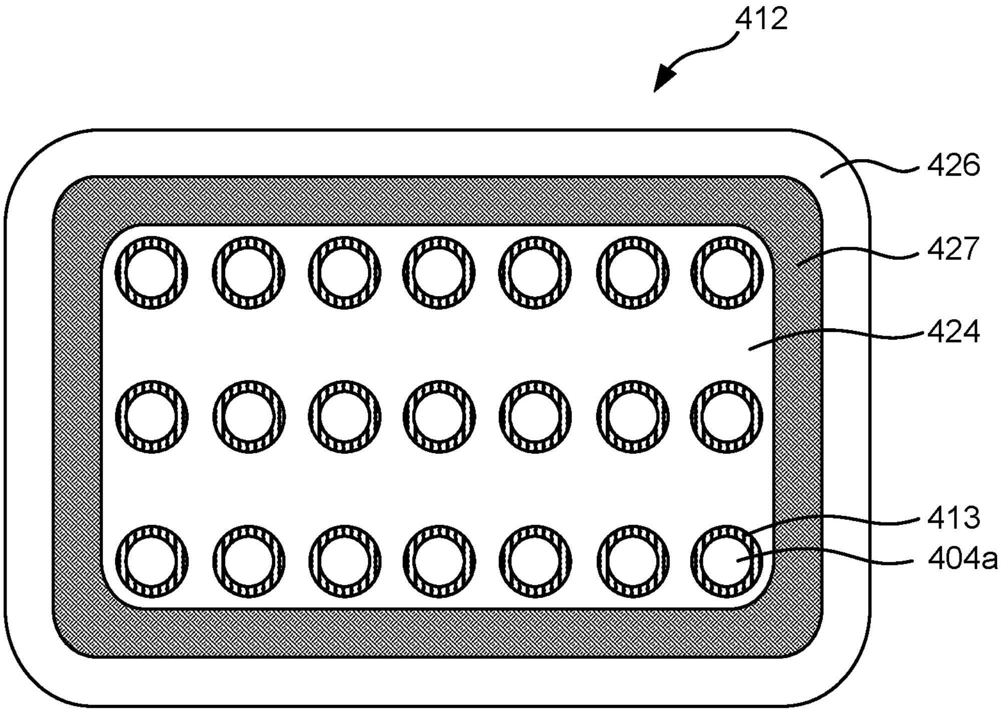
FIGS. 4A-4B illustrate partial plan views of alternative layouts of a vertical FET device according to some embodiments of the present invention.
Figure 4B:
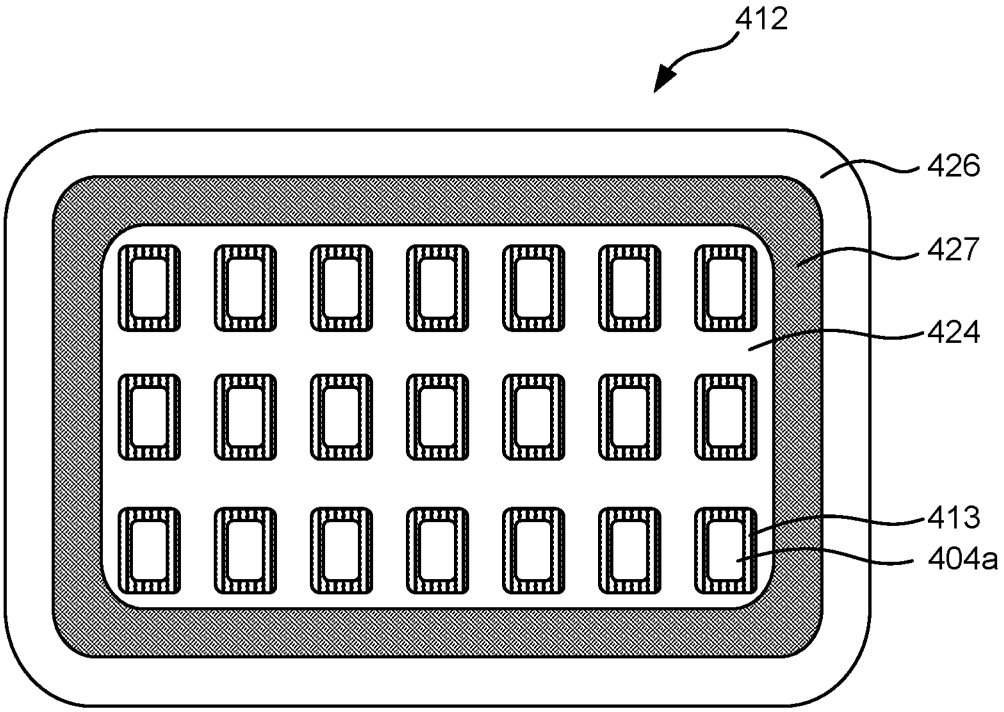

FIGS. 4A-4B illustrate plan views of alternative layouts of a vertical FET device according to some embodiments of the present invention. As shown in FIG. 4A and FIG. 4B, III-nitride gate layer 412 is formed on an III-nitride drift layer (not shown, e.g. first III-nitride layer 102*a* as shown in FIG. 3F). In some embodiments, the III-nitride drift layer may include n-type GaN material, and III-nitride gate layer 412 may include p-type GaN material. The III-nitride gate layer 412 may include an active region 424 and a terminal region 426 adjacent active region 424. A plurality of III-nitride fins 404*a* are formed on the III-nitride drift layer. In some embodiments, the plurality of III-nitride fins 404*a* each may have a circular cross-section as shown in FIG. 4A. In some embodiments, the plurality of III-nitride fins 404*a* each may have a rectangular cross-section as shown in FIG. 4B. It should be noted that the cross-section of the fins is not limited to a circular or rectangular shape as shown in FIGS. 4A-4B. Many variations of the cross-sections of fins are contemplated as appropriate to the particular applications. For example, a cross-section of triangular, hexagon, or oval shape may be appropriate to particular applications. In some embodiments, the plurality of III-nitride fins 404*a* may include n-type GaN material. The plurality of III-nitride fins 404*a* are located in active region 424. A plurality of source isolation regions 413 are formed in III-nitride gate layer 412 using an ion implantation process as described above referring to FIG. 3F. Each of source isolation regions 413 surrounds one of the plurality of III-nitride fins 404*a*. Source isolation regions 413 have a conductivity less than that of III-nitride gate layer 412. A tapered damage zone 427 is formed in terminal region 426 using an ion implantation process as described above referring to FIGS. 3I-3J. The tapered damage zone 427 has a conductivity less than that of III-nitride gate layer 412. Due to tapered damage zone 427, a tapered junction terminal structure (not shown) is formed in at least a portion of terminal region 426. It should be noted that FIG. 4A-4B do not show the source contact structure and gate contact structure for clarity of illustration.

Figure 5A:
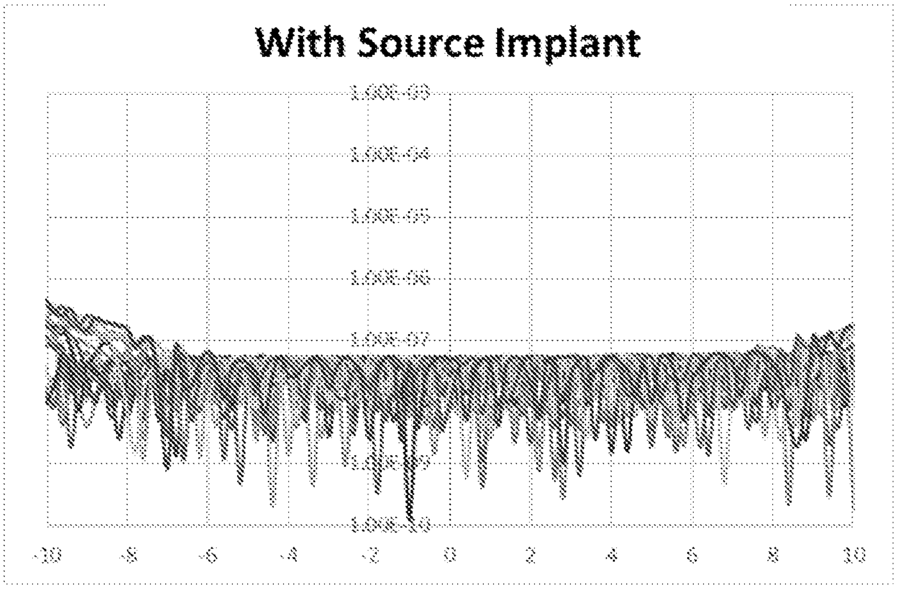
FIG. 5A illustrates a current-voltage curve of the source contact to the gate layer in a vertical FET device with a source isolation region according to some embodiments of the present invention.
Figure 5B:
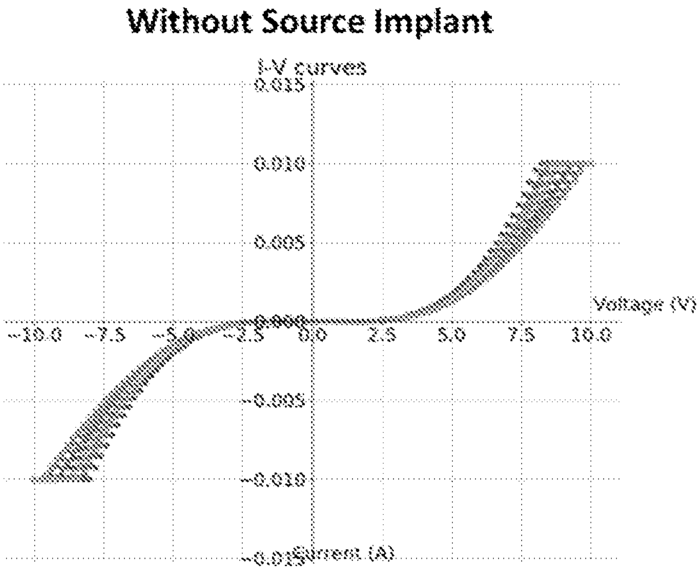
FIG. 5B illustrates a current-voltage curve of the source contact to the gate layer in a vertical FET device without the source isolation region.

FIG. 5A illustrates a current-voltage (IV) curve of the source contact to the gate layer in a vertical FET device with a source isolation region according to some embodiments of the present invention. FIG. 5B illustrates a current-voltage (IV) curve of the source contact to the gate layer in a vertical FET device without the source isolation region. As shown in FIG. 5A, the horizontal axis represents the voltage across the source contact (e.g., source contact structure 118 shown in FIG. 3P) to the gate layer (e.g., third III-nitride layer 112 shown in FIG. 3P) in units of volts (V), the vertical axis represents the current flowing from the source contact to the gate layer in units of amps (A). As shown in FIG. 5A, the current flowing from the source contact to the gate layer remains stable around $1.0\times10^{-7}$ A, and does not vary substantially with the voltage across the source contact to the gate layer. As shown in FIG. 5B, the horizontal axis represents the voltage across the source contact to the gate layer in units of volts (V), the vertical axis represents the current flowing from the source contact to the gate layer in units of amps (A). As shown in FIG. 5B, the current may remain stable in the low voltage range, such as in the range of −2.5 V to 2.5 V. However, out of the low voltage range, the current increases dramatically as the voltage across the source contact to the gate layer is increased, thereby demonstrating the effectiveness of the source isolation region.

It should be understood that the drawings are not drawn to scale, and similar reference numbers are used for representing similar elements. As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any possible combinations of one or more of the associated listed items.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present invention.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "below", "above", "higher", "lower", "over", and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

It is to be understood that the appended claims are not limited to the precise configuration illustrated in the drawings. One of ordinary skill in the art would recognize various modifications, alternatives, and variations may be made in the arrangement and steps of the methods and devices above without departing from the scope of the invention.

What is claimed is:

1. A method for manufacturing a vertical FET device, the method comprising:

providing a semiconductor substrate structure including a semiconductor substrate and a first semiconductor layer coupled to the semiconductor substrate, wherein the first semiconductor layer is characterized by a first conductivity type;

forming a plurality of semiconductor fins coupled to the first semiconductor layer, wherein each of the plurality of semiconductor fins is separated by one of a plurality of recess regions;

epitaxially regrowing a semiconductor gate layer in the plurality of recess regions, wherein the semiconductor gate layer comprises a surface region;

forming an electrically semi-insulating III-nitride isolation region within the surface region of the semiconductor gate layer, wherein the electrically semi-insulating III-nitride isolation region surrounds each of the plurality of semiconductor fins;

forming a source contact structure coupled to each of the plurality of semiconductor fins; and forming a gate contact structure coupled to the semiconductor gate layer.

2. The method of claim 1 wherein forming the electrically semi-insulating III-nitride isolation region within the surface region of the semiconductor gate layer comprises:

forming a first hardmask layer on an upper surface of the semiconductor gate layer, exposing a portion of the upper surface surrounding each of the plurality of semiconductor fins; and ion implanting species into the portion of the upper surface of the semiconductor gate layer using the first hardmask layer as a mask, wherein the species lower or neutralize a conductivity of the semiconductor gate layer.

3. The method of claim 2, wherein the species comprises nitrogen.

4. The method of claim 1, wherein the source contact structure covers a portion of the electrically semi-insulating III-nitride isolation region.

5. The method of claim 1, further comprising:

forming a photoresist on the semiconductor gate layer, wherein the semiconductor gate layer comprises an active region in which the plurality of semiconductor fins are formed and a terminal region adjacent the active region, and the photoresist comprises a tapered region aligned with the terminal region; and ion implanting species into the terminal region of the semiconductor gate layer using the photoresist as a mask, thereby forming a tapered element in the terminal region of the semiconductor gate layer, wherein the species lower or neutralize a conductivity of the terminal region of the semiconductor gate layer.

6. The method of claim 5, wherein ion implanting the species into the terminal region of the semiconductor gate layer is performed using ion energy of 30 keV and an implant dose of $6.5\times10^{12}$ atoms/$cm^2$.

7. The method of claim 5, wherein ion implanting the species into the terminal region of the semiconductor gate layer is performed using ion energy of 180 keV and an implant dose of $1.6\times10^{13}$ atoms/$cm^2$.

8. The method of claim 5, wherein ion implanting the species into the terminal region of the semiconductor gate layer is performed using ion energy of 600 keV and an implant dose of $2.5\times10^{13}$ atoms/$cm^2$.

9. The method of claim 1, wherein forming the source contact structure coupled to an upper portion of each of the plurality of semiconductor fins comprises:

forming a source mask layer on the semiconductor gate layer, exposing an upper surface of the plurality of semiconductor fins and a portion of the electrically semi-insulating III-nitride isolation region surrounding each of the plurality of semiconductor fins; and forming the source contact structure coupled to the upper surface of each of the plurality of semiconductor fins.

10. The method of claim 1, wherein forming the gate contact structure coupled to the semiconductor gate layer comprises:

forming a gate mask layer on the semiconductor gate layer, exposing a portion of an upper surface of the semiconductor gate layer; and forming the gate contact structure coupled to the portion of the upper surface of the semiconductor gate layer.

11. The method of claim 1, further comprising:

forming a first interlayer dielectric layer overlying the source contact structure and the gate contact structure;

forming a second interlayer dielectric layer on the first interlayer dielectric layer;

forming a mask on the second interlayer dielectric layer, exposing a portion of the second interlayer dielectric layer that is aligned with each of the plurality of semiconductor fins;

removing the second interlayer dielectric layer and the first interlayer dielectric layer using the mask to expose a portion of the source contact structure;

removing the mask; and forming a conductive material coupled to the portion of the source contact structure.

12. The method of claim 11 wherein the first interlayer dielectric layer comprises nitride and the second interlayer dielectric layer comprises oxide.

13. The method of claim 1, wherein:

forming the source contact structure coupled to an upper portion of each of the plurality of semiconductor fins comprises:

depositing a first source metal layer coupled to each of the plurality of semiconductor fins, wherein the first source metal layer comprises Ti;

depositing a second source metal layer coupled to the first source metal layer, wherein the second source metal layer comprises Al; and depositing a third source metal layer coupled to the second source metal layer, wherein the third source metal layer comprises Mo; and forming the gate contact structure coupled to the semiconductor gate layer comprises:

depositing a first gate metal layer coupled to the semiconductor gate layer, wherein the first gate metal layer comprises Ni;

depositing a second gate metal layer coupled to the first gate metal layer, wherein the second gate metal layer comprises Au;

depositing a third gate metal layer coupled to the second gate metal layer, wherein the third gate metal layer comprises Mo; and depositing a fourth gate metal layer coupled to the third gate metal layer, wherein the fourth gate metal layer comprises Au.

14. A method of manufacturing a vertical FET device, comprising:

providing a semiconductor substrate comprising a first semiconductor layer coupled to the semiconductor substrate, wherein the first semiconductor layer is characterized by a first conductivity type;

providing semiconductor fins disposed on the first semiconductor layer, wherein each of the semiconductor fins are laterally separated;

providing a semiconductor gate layer between the semiconductor fins;

providing an electrically semi-insulating III-nitride isolation region disposed within a portion of the semiconductor gate layer, wherein the electrically semi-insulating III-nitride isolation region surrounds each of the semiconductor fins;

providing a source contact structure coupled to each of the semiconductor fins; and providing a gate contact structure coupled to the semiconductor gate layer.

15. The method of claim 14, wherein providing the semiconductor gate layer comprises:

providing an active region in which the semiconductor fins are formed and a terminal region adjacent the active region, and providing a tapered element in the terminal region.

16. The method of claim 14, further comprising:

providing a second semiconductor layer characterized by graded conductivity disposed between the first semiconductor layer and the semiconductor fins, wherein:

the graded conductivity of the second semiconductor layer varies as a function of distance from the first semiconductor layer.

17. The method of claim 14, wherein:

providing the semiconductor fins comprises providing a cross-section of the semiconductor fins that is comprises a first shape; and providing the electrically semi-insulating III-nitride isolation region comprises providing the electrically semi-insulating III-nitride isolation region that comprises the first shape.

18. The method of claim 14, wherein:

providing the semiconductor fins comprises providing the semiconductor fins aligned in a same crystallographic direction.

19. A method of manufacturing a vertical FET device, comprising:

providing a semiconductor substrate comprising:

a first epitaxial semiconductor layer coupled to the semiconductor substrate, wherein the first epitaxial semiconductor layer is characterized by a first conductivity type; and a second epitaxial semiconductor layer coupled to the first epitaxial semiconductor layer, wherein the second epitaxial semiconductor layer is characterized by the first conductivity type and a graded doping profile;

providing semiconductor fins disposed on the second epitaxial semiconductor layer, wherein each of the semiconductor fins is separated by one of a plurality of recess regions;

providing a semiconductor gate layer in the plurality of recess regions and characterized by a second conductivity type opposite to the first conductivity type;

providing an electrically semi-insulating III-nitride isolation region disposed within a portion of the semiconductor gate layer, wherein the electrically semi-insulating III-nitride isolation region surrounds each of the semiconductor fins;

providing a source contact structure coupled to each of the semiconductor fins; and providing a gate contact structure coupled to the semiconductor gate layer.

20. The method of claim 19, further comprising:

providing a mask on the semiconductor gate layer, wherein the semiconductor gate layer comprises an active region in which the semiconductor fins are formed and a terminal region adjacent the active region, and the mask comprises a tapered region aligned with the terminal region; and ion implanting species into the terminal region of the semiconductor gate layer using the mask, thereby forming a tapered element in the terminal region of the semiconductor gate layer, wherein:

ion implanting the species into the terminal region of the semiconductor gate layer is performed using one or more ion implants with ion energy in a range from about 30 keV to about 600 keV and an implant dose in a range from about $6.5\times10^{12}$ atoms/$cm^2$ to about $2.5\times10^{13}$ atoms/$cm^3$.

* * * * *